United States Patent
Yamazaki

(10) Patent No.: US 9,431,984 B2
(45) Date of Patent: Aug. 30, 2016

(54) ACOUSTIC APPARATUS

(71) Applicant: CANON KABUSHIKI KAISHA, Tokyo (JP)

(72) Inventor: Yoshikazu Yamazaki, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 62 days.

(21) Appl. No.: 14/262,035

(22) Filed: Apr. 25, 2014

(65) Prior Publication Data

US 2014/0336801 A1 Nov. 13, 2014

(30) Foreign Application Priority Data

May 9, 2013 (JP) ................... 2013-099719

(51) Int. Cl.
*G06F 17/00* (2006.01)
*H03G 3/34* (2006.01)
*H03M 1/00* (2006.01)

(52) U.S. Cl.
CPC .......... *H03G 3/34* (2013.01); *H03M 1/002* (2013.01)

(58) Field of Classification Search
None
See application file for complete search history.

(56) References Cited

U.S. PATENT DOCUMENTS

| | | | |
|---|---|---|---|
| 5,675,282 A | 10/1997 | Saito | |
| 6,032,028 A * | 2/2000 | Dickey | H03C 3/40 332/117 |
| 7,521,971 B2 | 4/2009 | Yamazaki | |
| 7,906,998 B2 | 3/2011 | Yamazaki | |
| 8,085,098 B2 | 12/2011 | Yamazaki | |
| 8,334,713 B2 | 12/2012 | Yamazaki | |
| 8,456,231 B2 | 6/2013 | Yamazaki | |
| 8,531,239 B2 | 9/2013 | Yamazaki | |
| 2011/0300874 A1 * | 12/2011 | Chen | H04B 15/04 455/452.2 |
| 2013/0021096 A1 * | 1/2013 | Sugawara | H03F 3/217 330/251 |
| 2013/0119244 A1 | 5/2013 | Shibata et al. | |
| 2014/0104001 A1 | 4/2014 | Yamazaki | |

FOREIGN PATENT DOCUMENTS

| | | |
|---|---|---|
| JP | 08-054954 A | 2/1996 |
| JP | 2005045546 A | 2/2005 |

OTHER PUBLICATIONS

U.S. Appl. No. 14/190,842 filed by Shibata et al., Feb. 26, 2014

* cited by examiner

*Primary Examiner* — Fan Tsang
*Assistant Examiner* — David Siegel
(74) *Attorney, Agent, or Firm* — Fitzpatrick, Cella, Harper & Scinto

(57) ABSTRACT

An acoustic apparatus includes a signal processor configured to generate an analog audio signal based on a digital audio signal. The digital audio signal includes a first silent part and a sound part subsequent to the first silent part. The signal processor starts an operation in a period during which the first silent part is input.

12 Claims, 4 Drawing Sheets

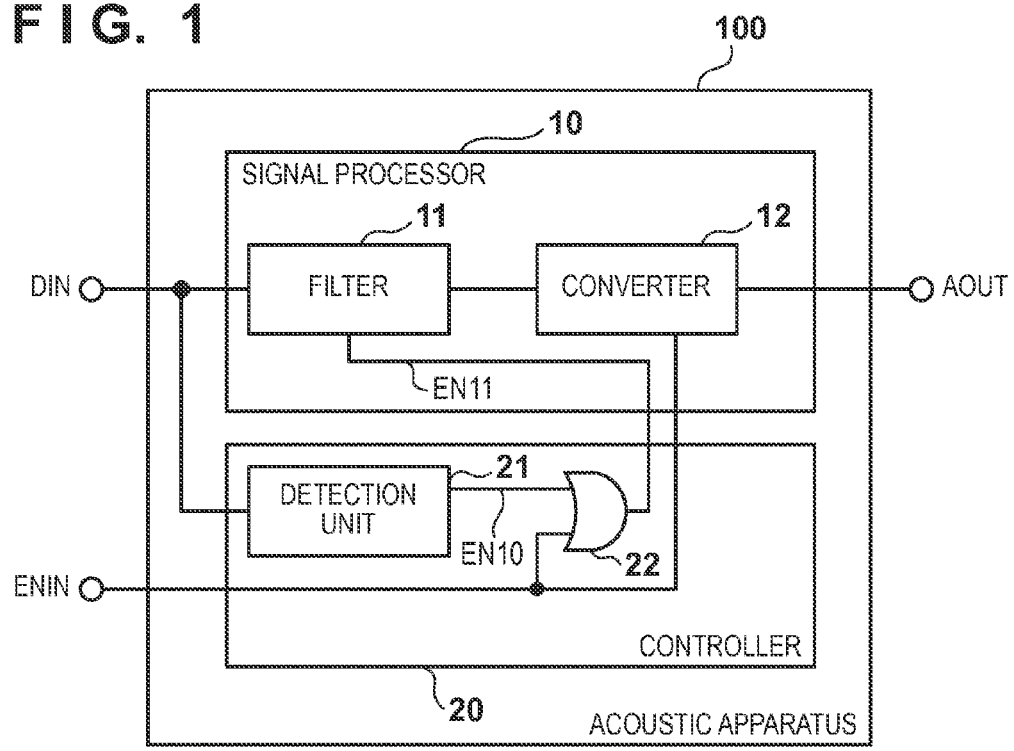
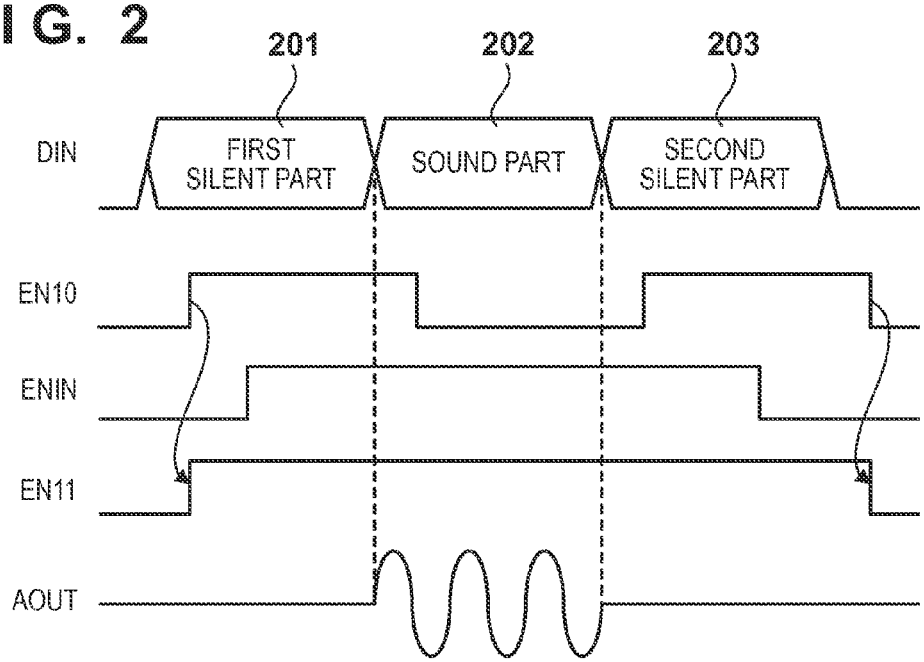

ACOUSTIC APPARATUS

BACKGROUND OF THE INVENTION

1. Field of the Invention

The present invention relates to an acoustic apparatus.

2. Description of the Related Art

In an audio field for an electronic device which captures moving images or still images, an audio amplifier which receives a digital data signal in a bit stream format and outputs an analog signal is used. The audio amplifier can be used to output an audio signal recorded concurrently with imaging when playing the moving images, or a beep sound for informing a user that an operation button is pressed. In the audio amplifier, it is important not to output noise called pop noise from a loudspeaker when switching an operation state for outputting an audio signal and a non-operation state for not outputting the audio signal.

Japanese Patent Laid-Open No. 2005-45546 describes a digital amplifier circuit that prevents the pop noise from being output when outputting the beep sound. This digital amplifier circuit includes a speech processing circuit, a confirmation sound generation circuit for generating an operation confirmation sound signal, a reference signal generation circuit for generating a reference level signal, an addition circuit for adding the operation sound confirmation signal and the reference level signal, and a selection circuit for selecting one of the output of the speech processing circuit and that of the addition circuit. This reference signal processing circuit gradually changes the reference level signal from a power-off level to a reference level of the digital audio signal, or vice versa.

The digital amplifier circuit described in Japanese Patent Laid-Open No. 2005-45546 requires the reference signal generation circuit for gradually changing the reference level signal, and the addition circuit for adding the operation sound confirmation signal and the reference level signal. Hence, the digital amplifier circuit has a complicated arrangement.

SUMMARY OF THE INVENTION

The present invention provides a technique advantageous for suppressing the generation of pop noise by a simpler arrangement.

One of the aspect of the present invention provides an acoustic apparatus comprising a signal processor configured to generate an analog audio signal based on a digital audio signal, wherein in a case where the digital audio signal includes a first silent part and a sound part subsequent to the first silent part, the signal processor starts an operation in a period during which the first silent part is input.

Further features of the present invention will become apparent from the following description of exemplary embodiments with reference to the attached drawings.

BRIEF DESCRIPTION OF THE DRAWINGS

FIG. 1 is a block diagram showing the arrangement of an acoustic apparatus according to the first embodiment of the present invention;

FIG. 2 is a chart showing the operation of the acoustic apparatus according to the first embodiment of the present invention;

DESCRIPTION OF THE EMBODIMENTS

Figure 3:
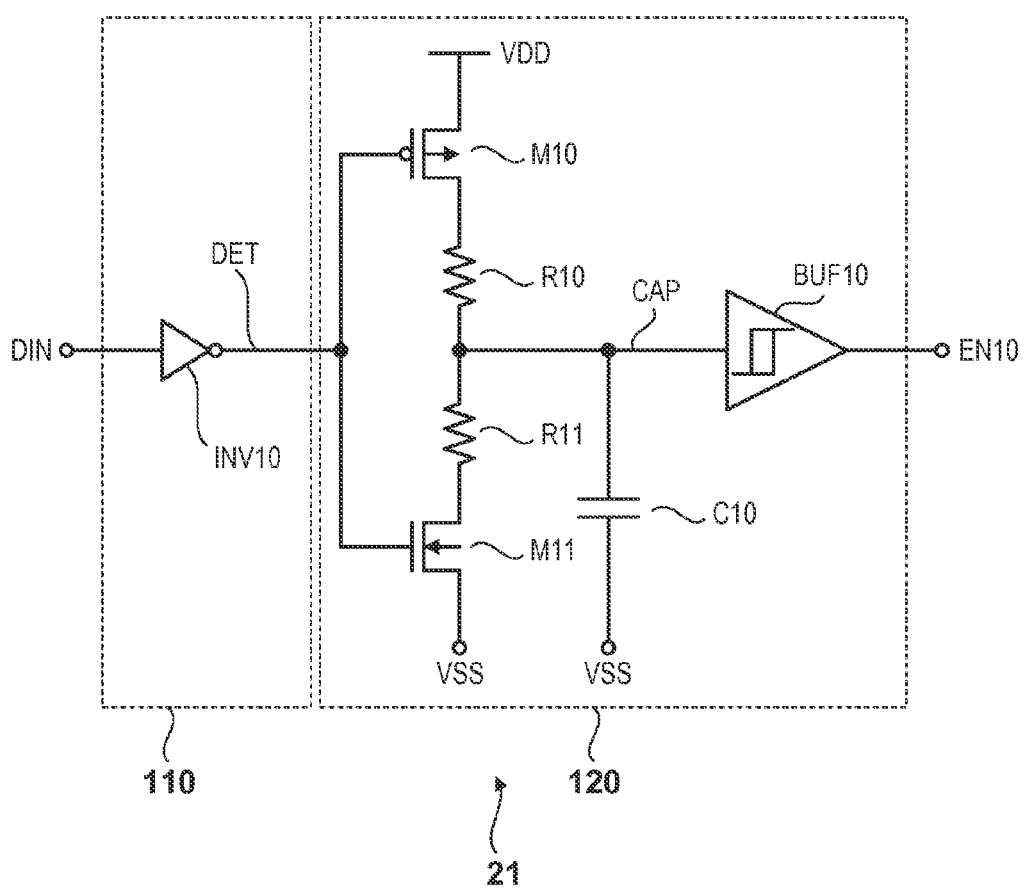
FIG. 3 is a circuit diagram showing an example of the arrangement of a detection unit.

Embodiments of the present invention will be described below with reference to the accompanying drawings.

An acoustic apparatus 100 according to the first embodiment of the present invention will be described with reference to FIGS. 1 to 4. The acoustic apparatus 100 can be configured as an audio amplifier. As shown in FIG. 1, the acoustic apparatus 100 includes a signal processor 10 for generating an analog audio signal AOUT based on a digital audio signal DIN. The signal processor 10 can include a filter 11 for filtering the digital audio signal DIN, and a converter 12 for converting the signal output from the filter 11 to the analog audio signal AOUT. The converter 12 can include an amplification circuit for driving an audio output unit such as a loudspeaker. Here, the digital audio signal DIN can be, for example, a digital audio signal generated by a second-order Σ A/D converter. The filter 11 can be a low-pass filter having a third-order characteristic.

The acoustic apparatus 100 can also include a controller 20 for controlling the signal processor 10. The controller 20 can, for example, control the signal processor 10 in response to a control signal ENIN and the digital audio signal DIN. As shown in FIG. 2, the digital audio signal DIN includes a first silent part 201, a sound part 202 subsequent to the first silent part 201, and a second silent part 203 subsequent to the sound part 202. The signal processor 10 can be controlled by the controller 20 to start an operation in a period during which the first silent part 201 is input. Also, the signal processor 10 can be controlled by the controller 20 to stop the operation in a period during which the second silent part 203 is input or after the period during which the second silent part 203 is input. For example, the sound part 202 can be a part including a signal sequence for a beep sound, but may be a part including an audio signal sequence.

The controller 20 can be configured to detect the first silent part 201 and second silent part 203, and cause the signal processor 10 to start an operation in response to the detection of the first silent part 201 and stop the operation in response to the detection of the second silent part 203. The controller 20 can be configured to operate the converter 12 in response to an externally provided control signal ENIN in a state in which the filter 11 is operating.

The controller 20 can include a detection unit 21 which detects the first silent part 201 and second silent part 203, and sets a detection signal EN10 to an active level in response to that detection. The controller 20 can also include a logical circuit 22 which generates a filter control signal EN11 for controlling the filter 11 based on the detection signal EN10 and externally provided control signal ENIN. Here, the control signal ENIN can be controlled by an external controller (not shown) to transit to the active level in the first silent part 201 and to an inactive level in the second silent part 203. The logical circuit 22 can be, for example, a logical sum circuit which calculates the logical sum of the detection signal EN10 and control signal ENIN. The filter 11 executes an operation (filtering) when the filter control signal EN11 is at the active level (high level in this example). The converter 12 can be controlled by the control signal ENIN. The converter 12 executes an operation (conversion) when the control signal ENIN is at the active level (high level in this example).

As shown in FIG. 2, the digital audio signal DIN and control signal ENIN are fixed at low level in an initial state. The first silent part 201 and second silent part 203 of the digital audio signal DIN can be, in a bit stream format, a pulse signal with the equal ratio between a high-level period and a low-level period (that is, the duty ratio of about 50%). The detection unit 21 transits the detection signal EN10 to the active level (high level) in order to indicate the detection of the first silent part 201 when the first silent part 201 has continued for a certain time or more. In addition, the detection unit 21 transits the detection signal EN10 to the active level (high level) in order to indicate the detection of the first silent part 201 when the second silent part 203 has continued for a certain time.

The control signal ENIN is controlled by the external circuit (not shown) to be at the active level after a timing at which the first silent part 201 has continued for a certain time, and at the inactive level after a timing at which the second silent part 203 has continued for a certain time. The filter 11 executes the operation (filtering) when the filter control signal EN11 generated according to the detection signal EN10 and control signal ENIN is at the active level (high level). The converter 12 executes the operation (conversion) when the control signal ENIN is at the active level (high level).

In the sound part 202 of the digital audio signal DIN, the sound part 202 is filtered by the filter 11, and the filtered signal output from the filter 11 is output to the analog audio signal AOUT by the converter 12. For example, when the sound part 202 is a signal of a beep sound, the analog audio signal AOUT corresponding to the beep sound is output.

As described above, in the first embodiment, the filter 11 starts an operation in an input period of the first silent part 201 in response to the detection of the first silent part 201, and then the converter 12 starts an operation in the input period of the first silent part 201 in response to the control signal ENIN. This makes it possible to prevent pop noise from being output from the loudspeaker driven by the analog audio signal AOUT at the start of the sound part. Also in the first embodiment, the converter 12 stops an operation in a period of the second silent part or the subsequent period in response to the control signal ENIN, and then the filter 11 stops an operation in response to the detection of the second silent part 203. This makes it possible to prevent the pop noise from being output from the loudspeaker driven by the analog audio signal AOUT at the end of the sound part. Furthermore, it is possible to reduce power consumption by causing the filter 11 to start the operation in response to the detection of the first silent part 201 and stop the operation in response to the detection of the second silent part 203.

FIG. 3 shows an example of the arrangement of the detection unit 21. The detection unit 21 can include an input unit 110 and period detection unit 120. The input unit 110, for example, outputs a signal DET obtained by inverting the logical level of the digital audio signal DIN. The input unit 110 can include an inverter INV10. The period detection unit 120 detects that the silent part has continued for a certain period. The period detection unit 120 can include a PMOS transistor M10, NMOS transistor M11, resistor R10, resistor R11, capacitor C10, and buffer circuit BUF10.

The source of the PMOS transistor M10 is connected to a VDD line serving as a power supply line, the drain of the PMOS transistor M10 is connected to one end of the resistor R10, and the signal DET is input to the gate of the PMOS transistor M10. The source of the NMOS transistor M11 is connected to a VSS line as a reference potential line, the drain of the NMOS transistor M11 is connected to one end of the resistor R11, and the signal DET is input to the gate of the NMOS transistor M11. The other end of the resistor R10 and the other end of the resistor R11 are interconnected, and connected to one end of the capacitor C10 and an input terminal of the buffer circuit BUF 10. The other end of the resistor R10, the other end of the resistor R11, one end of the capacitor C10, and the input terminal of the buffer circuit BUF 10 configure a node CAP. The resistance value of the resistor R11 is sufficiently larger than that of the resistor R10. Input/output characteristics of the buffer circuit BUF 10 have a hysteresis characteristic. The PMOS transistor M10, NMOS transistor M11, resistor R10, and resistor R11 configure an inverter whose drivability on a pull-up side is higher than that on a pull-down side.

Figure 4:
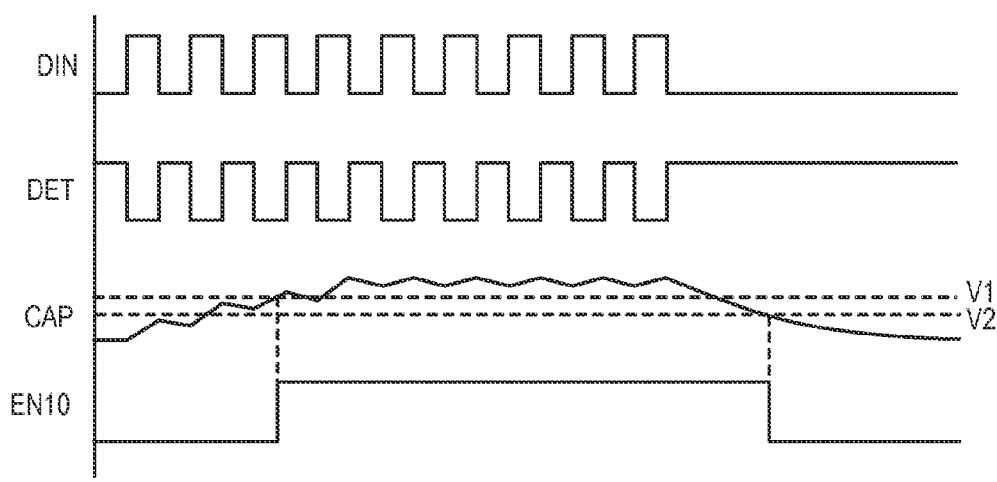
FIG. 4 is a chart showing an example of the operation of the detection unit.

The operation of the detection unit 21 shown in FIG. 5 will be described with reference to FIG. 4. An inverter INV10 of the input unit 110 outputs the signal DET obtained by inverting the logical level of the digital audio signal DIN. When the signal DET is at low level, the PMOS transistor M10 is turned on and the NMOS transistor M11 is turned off. At this time, a current flows in the capacitor C10 through the resistor R10 from the VDD line, thereby charging the capacitor C10. As a result, potential of the node CAP rises. When the signal DET is at high level, the PMOS transistor M10 is turned off and the NMOS transistor M11 is turned on. At this time, the current flows in the VSS line from the capacitor C10 through the resistor R11, thereby discharging the capacitor C10. Here, the resistance value of the resistor R11 is sufficiently larger than that of the resistor R10, so that a current value at the time of discharging is much smaller than that at the time of charging. Hence, when the detection unit 21 receives a pulse signal sequence (silent part) with the duty ratio of 50%, the potential of the node CAP (one end of the capacitor C10) rises gradually. Then, the control signal EN10 transits from low level to high level in response to the fact that the potential of the node CAP exceeds a first threshold V1 of the buffer circuit BUF 10.

If the digital audio signal DIN is fixed to low level, the signal DET is fixed to high level. As a result, the capacitor C10 is kept discharged. Then, the control signal EN10 transits from high level to low level in response to the fact that the potential of the node CAP falls below a second threshold V2 of the buffer circuit BUF 10.

As described above, according to the first embodiment, it is possible to suppress the generation of the pop noise by a simple arrangement. Furthermore, according to the first embodiment, it is possible to reduce power consumption by causing the filter 11 to start the operation in response to the detection of the first silent part 201 and stop the operation in response to the detection of the second silent part 203.

In the first embodiment, the controller 20 controls the operation of the filter 11 based on the detection of a silent signal. However, the controller 20 may control both operations of the filter 11 and converter 12 based on the detection of the silent signal. For example, the controller 20 can cause the filter 11 to start the operation in response to the detection signal of a first silent signal and the converter 12 to operate only in a certain period in response to a signal obtained by delaying this detection signal. The controller 20 causes the converter 12 to stop the operation after an elapse of this certain period, and then causes the filter 11 to stop the operation. This example is useful when the length of the sound part subsequent to the first silent part is determined in advance.

An acoustic apparatus 100 according to the second embodiment of the present invention will be described below with reference to FIGS. 5 and 6. Note that matters not mentioned in the second embodiment can comply with the first embodiment. The acoustic apparatus 100 according to the second embodiment includes a controller 30 instead of the controller 20 in the acoustic apparatus 100 according to the first embodiment. The controller 30 causes a signal processor 10 to start an operation in response to the fact that an externally provided control signal ENIN has entered a first state (active level) and stop the operation in response to the fact that the control signal ENIN has entered a second state (inactive level).

Figure 5:
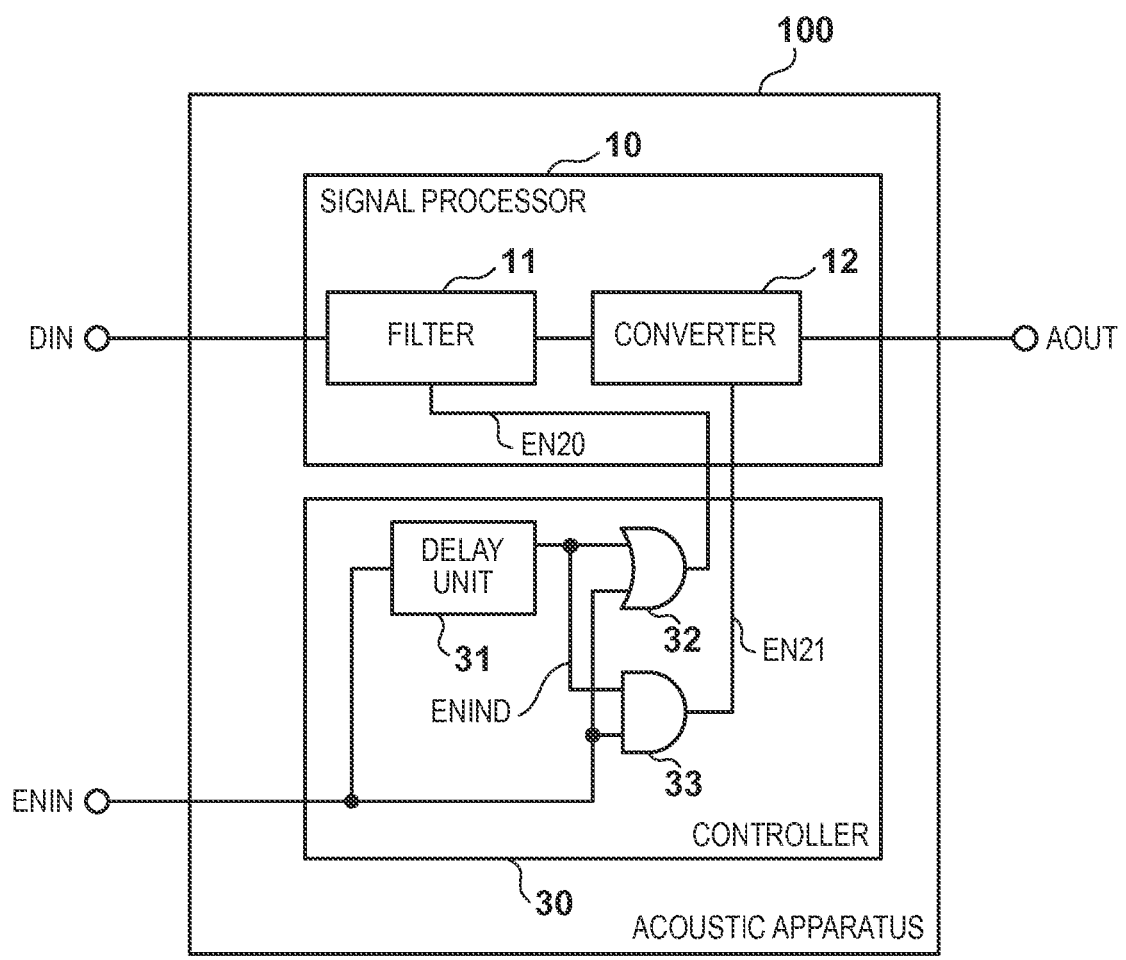
FIG. 5 is a block diagram showing the arrangement of an acoustic apparatus according to the second embodiment of the present invention.

As shown in FIG. 5, the controller 30 can include, for example, a delay unit 31, logical circuit 32, and logical circuit 33. The delay unit 31 generates a delayed control signal ENIND by delaying the control signal ENIN. The logical circuit 32 can include a logical sum circuit which calculates the logical sum of the control signal ENIN and delayed control signal ENIND. The logical circuit 33 can include a logical product circuit which calculates the logical product of the control signal ENIN and delayed control signal ENIND.

Figure 6:
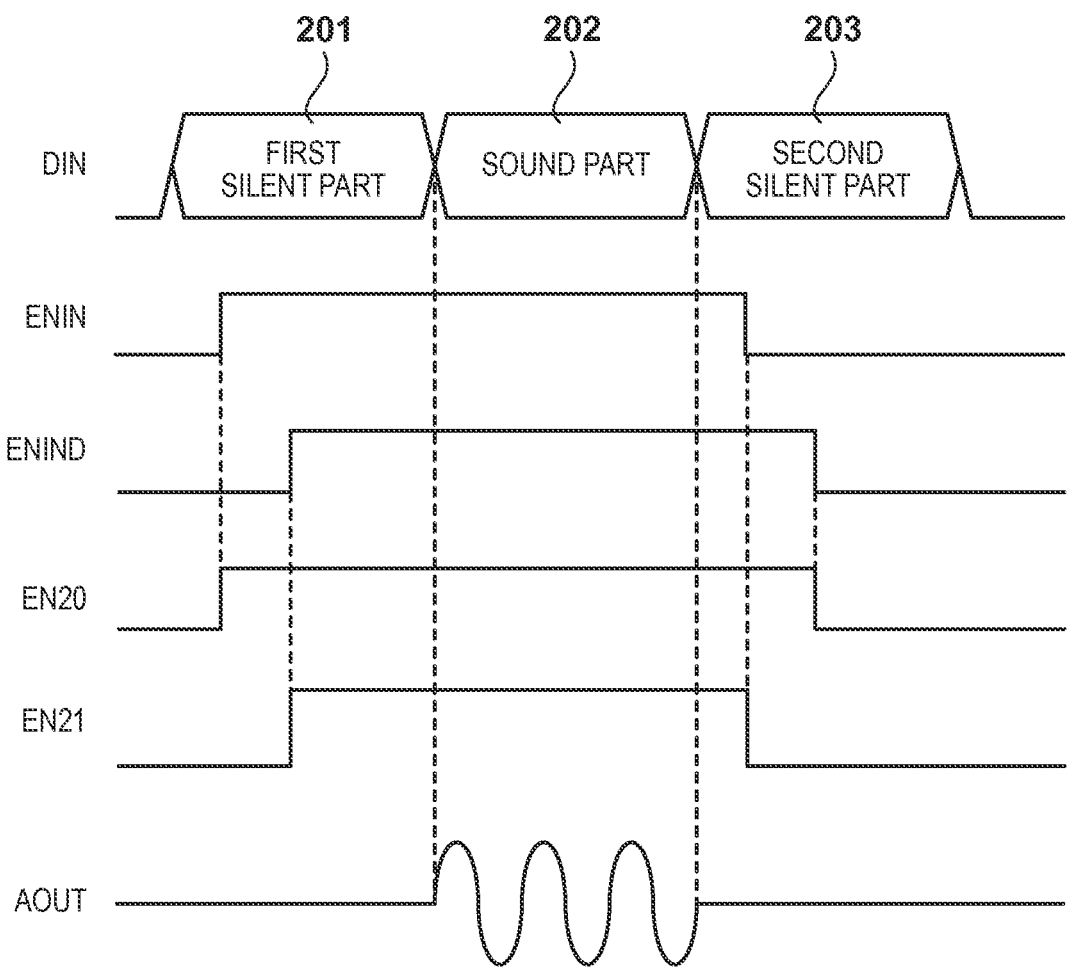
FIG. 6 is a chart showing the operation of the acoustic apparatus according to the second embodiment of the present invention.

As shown in FIG. 6, a digital audio signal DIN and the control signal ENIN are fixed at low level in an initial state. The control signal ENIN can be controlled by an external controller (not shown) to transit to the first state (active level) in a first silent part 201 and to the second state (inactive level) in a second silent part 203. The logical circuit 32 generates a second control signal EN20 for controlling a filter 11 by calculating the logical sum of the control signal ENIN and delayed control signal ENIND. The controller 30 causes the filter 11 to start the operation in response to the first silent part 201 by the second control signal EN20. The controller 30 also causes the filter 11 to stop the operation in the second silent part 203. The logical circuit 33 generates a third control signal EN21 for controlling a converter 12 by calculating the logical product of the control signal ENIN and delayed control signal ENIND. The controller 30 operates the converter 12 by the third control signal EN21.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-099719, filed May 9, 2013, which is hereby incorporated by reference herein in its entirety.

What is claimed is:

1. An acoustic apparatus comprising:
   a signal processor configured to perform an operation of generating an analog audio signal based on a digital audio signal; and
   a controller configured to control the signal processor,
   wherein the signal processor includes a filter configured to filter the digital audio signal, and a converter configured to convert the signal output from the filter to the analog audio signal,
   wherein in a case where the digital audio signal includes a first part corresponding to a first silent part of the analog audio signal, a second part subsequent to the first part and corresponding to a sound part of the analog audio signal, and a third part subsequent to the second part and corresponding to a second silent part of the analog audio signal, the signal processor starts the operation in a period during which the first part is being input, and the signal processor stops the operation in a period during which the third part is input or after the period during which the third part is input,
   wherein the controller detects the first part and the third part, and causes the signal processor to start the operation in response to the detection of the first part and stop the operation in response to the detection of the third part, and
   wherein the controller causes the filter to start the operation in response to the detection of the first part and stop the operation in response to the detection of the third part.

2. The apparatus according to claim 1, wherein the controller operates the converter in response to an externally provided control signal in a state in which the filter is operating.

3. The apparatus according to claim 1, wherein the controller operates the converter only in a certain period after causing the filter to start the operation.

4. An acoustic apparatus comprising:
   a signal processor configured to perform an operation of generating an analog audio signal based on a digital audio signal; and
   a controller configured to control the signal processor,
   wherein the signal processor includes a filter configured to filter the digital audio signal, and a converter configured to convert the signal output from the filter to the analog audio signal,
   wherein in a case where the digital audio signal includes a first part corresponding to a silent part of the analog audio signal and a second part subsequent to the first part and corresponding to a sound part of the analog audio signal, the signal processor starts the operation in a period during which the first part is being input,
   wherein in a case where the digital audio signal further includes a third part subsequent to the second part and corresponding to a silent part of the analog audio signal, the signal processor stops the operation in a period during which the third part is input or after the period during which the third part is input,
   wherein the controller causes the signal processor to start the operation in response to an event that an externally provided control signal has entered a first state and stop the operation in response to an event that the externally provided control signal has entered a second state,
   wherein the controller causes the filter to start the operation in the first part and stop the operation in the third part, in response to a logical sum of the control signal and a delayed control signal obtained by delaying the control signal, and
   wherein the controller operates the converter in response to a logical product of the externally provided control signal and the delayed control signal.

5. The apparatus according to claim 1, wherein the controller is further configured to output a control signal, to cause the signal processor to start the operation, in a case where the first part has continued for a certain time or more.

6. The apparatus according to claim 1, wherein the filter is changed into an active state from an inactive state at a timing in the period during which the first part is being input, and the converter is changed into an active state from an inactive state at a timing in the period during which the first part is being input.

7. The apparatus according to claim 6, wherein the converter is changed into the active state after the filter is changed into the active state.

8. The apparatus according to claim 1,
   wherein the controller detects the first part, and causes the signal processor to start the operation, in response to the detection of the first part.

9. The apparatus according to claim 8, wherein the controller causes the filter to start the operation, in response to the detection of the first part.

10. The apparatus according to claim 9, wherein the controller operates the converter in response to an externally provided control signal in a state in which the filter is operating.

11. The apparatus according to claim 1, wherein
- the operation of generating an analog audio signal includes filtering the digital audio signal by the filter, and
- the signal processor provides an enable signal for the filter as a start of the operation.

12. The apparatus according to claim 1, wherein the signal processor provides an enable signal for the converter as a start of the operation.

* * * * *